(12) United States Patent
Palles-Dimmock

(10) Patent No.: US 10,615,358 B1
(45) Date of Patent: Apr. 7, 2020

(54) LIGHT-EMITTING DEVICE WITH HIGH CARRIER MOBILITY QD LAYER

(71) Applicant: Sharp Kabushiki Kaisha, Osaka (JP)

(72) Inventor: James Andrew Roberts Palles-Dimmock, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/162,906

(22) Filed: Oct. 17, 2018

(51) Int. Cl.
| | |
|---|---|
| H01L 51/42 | (2006.01) |
| H01L 51/50 | (2006.01) |
| C08G 73/02 | (2006.01) |
| C08G 61/12 | (2006.01) |
| H01L 51/52 | (2006.01) |
| H01L 51/00 | (2006.01) |

(52) U.S. Cl.
CPC .......... H01L 51/502 (2013.01); C08G 61/124 (2013.01); C08G 73/02 (2013.01); H01L 51/006 (2013.01); H01L 51/0072 (2013.01); H01L 51/5048 (2013.01); H01L 51/5088 (2013.01); H01L 51/5221 (2013.01)

(58) Field of Classification Search
None
See application file for complete search history.

(56) References Cited

U.S. PATENT DOCUMENTS

| | | |
|---|---|---|
| 8,343,636 B2 | 1/2013 | Jen et al. |
| 9,525,148 B2 | 12/2016 | Kazlas et al. |
| 2014/0264259 A1* | 9/2014 | Shim .................... B82Y 30/00 257/13 |
| 2018/0287089 A1* | 10/2018 | Ushikubo ........... H01L 51/5048 |

FOREIGN PATENT DOCUMENTS

| | | |
|---|---|---|
| CN | 106410051 | 2/2017 |
| KR | 101626525 | 6/2016 |

OTHER PUBLICATIONS

Wang et al (Quasi-Type II Carrier Distribution in CdSe/CdS Core/Shell Quantum Dots with Type I Band Alignment), May 7, 2018,The Journal of Physical Chemistry,12038-12046 (Year: 2018).*

(Continued)

*Primary Examiner* — Ali Naraghi
(74) *Attorney, Agent, or Firm* — Renner, Otto, Boisselle & Sklar, LLP

(57) ABSTRACT

A light-emitting device includes an emissive layer in which first and second charge carriers recombine to emit light; a first electrode from which the first charge carriers are generated and a second electrode from which the second charge carriers are generated; a first charge transport layer that injects the first charge carriers from the first electrode into the emissive layer; and a second charge transport layer that injects the second charge carriers from the second electrode into the emissive layer. The emissive layer includes quantum dots having a core in which the first and second charge carriers recombine and a shell, and at least a portion of the quantum dots have a Quasi-Type II configuration in which the first charge carriers are confined to the core and the second charge carriers are non-confined charge carriers that are not confined to the core or the shell. The confined charge carriers may be the electrons and the non-confined charge carriers may be the holes, or vice versa.

20 Claims, 7 Drawing Sheets

(56) References Cited

OTHER PUBLICATIONS

Lee et al.: "A solution-processable inorganic hole injection layer that improves the performance of quantum-dot light-emitting diodes" Current Applied Physics 17 (2017) pp. 442-447.
Dai et al.: "Solution-processed, high-performance light-emitting diodes based on quantum dots", Nature, vol. 515, Nov. 6, 2014, www.nature.com/doifinder/10.1038/nature13829.
Li et al.: "Bright colloidal quantum dot light-emitting diodes enabled by efficient chlorination", Nature Photonics, vol. 12, No. 164, Mar. 2018, pp. 159-164, https://doi.org/10.1038/s41566-018-0105-8.
Kagan et al.: "Building devices from colloidal quantum dots", Science, Aug. 26, 2016, vol. 353, Issue 6302, doi: 10.1126/science.aac5523.

\* cited by examiner

LIGHT-EMITTING DEVICE WITH HIGH CARRIER MOBILITY QD LAYER

TECHNICAL FIELD

The present invention relates to configurations of quantum dot (QD) light emitting diodes (LEDs), and in particular to QD LEDs using QDs with a particular core/shell structure so as to enhance the carrier mobility of the limiting charge carrier.

BACKGROUND ART

An example of a conventional light-emitting device is described in U.S. Pat. No. 9,525,148 (Kazlas et al., issued Dec. 20, 2016). FIG. 1 is a drawing depicting an exemplary representation of such a light-emitting device. As a structural overview, a light-emitting device includes an anode 104 and cathode 100, and a light-emitting or emissive layer 102 containing a material that emits light 107. Within the light-emitting emissive layer 102, light is produced upon electron and hole recombination to generate the light 108. The emissive layer 102 may be an inorganic or organic semiconductor layer, or a layer of quantum dots (QDs). At least one hole transport layer 103 is located between the anode 104 and the emissive layer 102, which provides transport of holes from the anode and injection of holes into the emissive layer. Similarly, at least one electron transport layer 101 is located between the cathode 100 and emissive layer 102, which provides transport of electrons from the cathode and injection of electrons into the emissive layer.

In such structures, the layer (or layers) 101 between the cathode 100 and emissive layer 102 is termed the electron transport layer (ETL), and the layer (or layers) 103 between the anode 104 and the emissive layer 102 is termed the hole transport layer (HTL). The ETL and HTL are collectively referred to more generally as charge transport layers (CTL). The purpose of these CTLs is to provide an ohmic contact to the respective electrode (anode or cathode), and to provide energetic alignment for injecting carriers (electrons or holes) into the emissive layer. To enhance the luminescence quantum efficiency of a QD LED, the mobility of the charge carriers should ideally be as high as possible in absolute terms, to reduce resistive losses, and be balanced in relative terms between electrons and holes, to reduce non-radiative auger recombination. These criteria should be met both within each layer, including each HTL, ETL, and emissive layer, and also between layers, such as balancing HTL hole mobility and ETL electron mobility.

Several approaches, therefore, have been explored to enhance the luminescence quantum efficiency of the light-emitting device. One approach is balancing injection of electrons from the ETL into the QDs in the emissive layer with the injection of holes from the HTL by adjusting the relative mobilities of electrons and holes, such as by employing injection barriers. Examples of such an approach include particular material selection as taught in KR 101626525 (Yang et al., issued Jun. 1, 2016) and CN 106410051 (Zheng et al., published Feb. 15, 2017), or by using an interlayer to adjust the injection barrier as taught in PMMA: DOI: 10.1038/nature13829. Another approach is increasing the mobility of both charge carriers in the QD layer by substituting long ligands with shorter ligands or inorganic passivating groups, as taught in DOI: 10.1038/s41566-018-0105-8. Another approach is increasing the mobility of the limiting charge carrier in the emissive layer, typically the holes as they have larger mass than the electrons, by mixing the QDs with, for example, a hole transporting material, as taught in DOI: 10.1016/j.cap.2016.12.024 and U.S. Pat. No. 8,343,636 (Kwan-Yue et al, issued Jan. 1, 2013).

As is termed by those of ordinary skill in the art, a Type I QD is a QD in which each electron and hole is confined to the core of the quantum dot. When both the electron and hole are confined to the core of the quantum dot, the wavefunctions of the electron and hole have maximum overlap within the QD core, which provides for a high rate of recombination in the emissive layer. Accordingly, the conventional teaching is to employ Type I QDs as the optimum QD to use for light-emitting devices (see, e.g., DOI: 10.1126/science.aac5523) because they have the highest core overlap between electron and hole wavefunctions, and therefore most encourage radiative recombination. However, films made of colloidal Type I QDs exhibit very low charge carrier mobilities, and in particular, often a very low hole mobility. This can result in recombination in only a single monolayer of QDs adjacent to the HTL, resulting in overall low quantum efficiency devices which operate at high voltage. In this manner, the high recombination rate of Type I QDs can be offset by the lower carrier mobility (especially low hole mobility), which reduces the resultant luminescence quantum efficiency of a QD LED.

SUMMARY OF INVENTION

There is a need in the art, therefore, for an improved quantum dot (QD) configuration that maximizes luminescence quantum efficiency, by optimizing a balance between the rate of recombination versus charge carrier mobility, and especially hole mobility. To increase the limiting carrier mobility in a QD layer, the present invention uses an emissive layer having at least a portion of QDs with a Quasi-Type II confinement configuration. In a Quasi-Type II confinement configuration, one type of charge carrier is confined to the QD core while the other type of charge carrier is not confined to the core or shell of the QD. In a preferred embodiment, the non-confined charge carriers are the holes, insofar as hole mobility tends to be most limiting to luminescence quantum efficiency due to the substantially larger mass of the holes relative to the electrons.

By using a Quasi-Type II QD structure, the overlap of the wavefunctions of holes and electrons in the QD core is decreased relative to a conventional Type I QD structure, insofar as holes may be present in both the cores and shells of the QDs, although a significant wavefunction overlap will still remain as between holes in the QD core and the electrons (which remain confined to the core). The result is that the relative rate of recombination is reduced using a Quasi-Type II QD structure relative to the conventional Type I QD structure. However, using a Quasi-Type II QD structure with non-confined holes achieves substantially enhanced hole mobility as compared to the conventional Type I QD structures. Accordingly, an optimal combination of recombination rate and charge carrier (hole) mobility is achieved, whereby the overall luminescence quantum efficiency is enhanced when using an emissive layer that includes Quasi-Type II QD structures alternatively or in addition to the conventional Type I QD structures. As referenced above, the conventional teaching is to employ only a Type I QD structure to maximize the recombination rate. The present invention, therefore, which uses a Quasi-Type II QD structure, achieves unexpected and enhanced results as compared to the conventional configurations and related teachings as to how to structure the QDs.

In exemplary embodiments, a light emitting device includes an anode and a cathode, and a light-emitting emissive layer containing a material that emits light by electron and hole recombination. At least one hole transport layer is located between the anode and the emissive layer, which provides transport of holes from the anode and injection of holes into the emissive layer. Similarly, at least one electron transport layer is located between the cathode and the emissive layer, which provides transport of electrons from the cathode and injection of electrons into the emissive layer. The emissive layer includes quantum dots whereby at least a portion of the quantum dots have a Quasi-Type II band structure. In exemplary embodiments, the Quasi-Type II band structure provides for confinement of electrons in the QDs cores, while the holes are not confined and may be present in the QD cores or shells.

The emissive layer may include only Quasi-Type II QDs, or the emissive layer may include a mixture or matrix of Quasi-Type II QDs and Type I QDs in combination. The use of such a mixture or matrix further balances the benefits of increased carrier mobility from Quasi-Type II QDs while still maintaining the higher radiative recombination rate of Type I QDs. In this manner, a configuration of the emissive layer is achieved that optimizes overall luminescence quantum efficiency.

An aspect of the invention, therefore, is a light-emitting device by which luminescence quantum efficiency is enhanced by configuring the emissive layer to include quantum dots a portion of which have a Quasi-Type II configuration. In exemplary embodiments, a light-emitting device includes an emissive layer in which first and second charge carriers recombine to emit light; a first electrode from which the first charge carriers are generated and a second electrode from which the second charge carriers are generated; a first charge transport layer that injects the first charge carriers from the first electrode into the emissive layer; and a second charge transport layer that injects the second charge carriers from the second electrode into the emissive layer. The emissive layer includes quantum dots having a core in which the first and second charge carriers recombine and a shell, and at least a portion of the quantum dots have a Quasi-Type II configuration in which the first charge carriers are confined to the core and the second charge carriers are non-confined charge carriers that are not confined to the core or the shell. The first (confined) charge carriers may be the electrons and the second (non-confined) charge carriers may be the holes, or vice versa. The non-confined charge carriers have a discontinuity in the corresponding band structure (valence band for non-confined holes; conduction band for non-confined electrons) that is 0.1 eV or less, and preferably 0.05 eV or less.

In a preferred embodiment, the first charge transport layer is an electron transport layer and the first charge carriers are electrons, whereby the confined charged carriers are the electrons and the electrons have a discontinuity in the conduction band. The second charge transport layer is a hole transport layer and the second charge carriers are holes, whereby the non-confined charge carriers are the holes and the holes are substantially continuous in the valence band. The non-confined holes have a discontinuity in the valence band that is 0.1 eV or less, and preferably 0.05 eV or less.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF EMBODIMENTS

Figure 1:
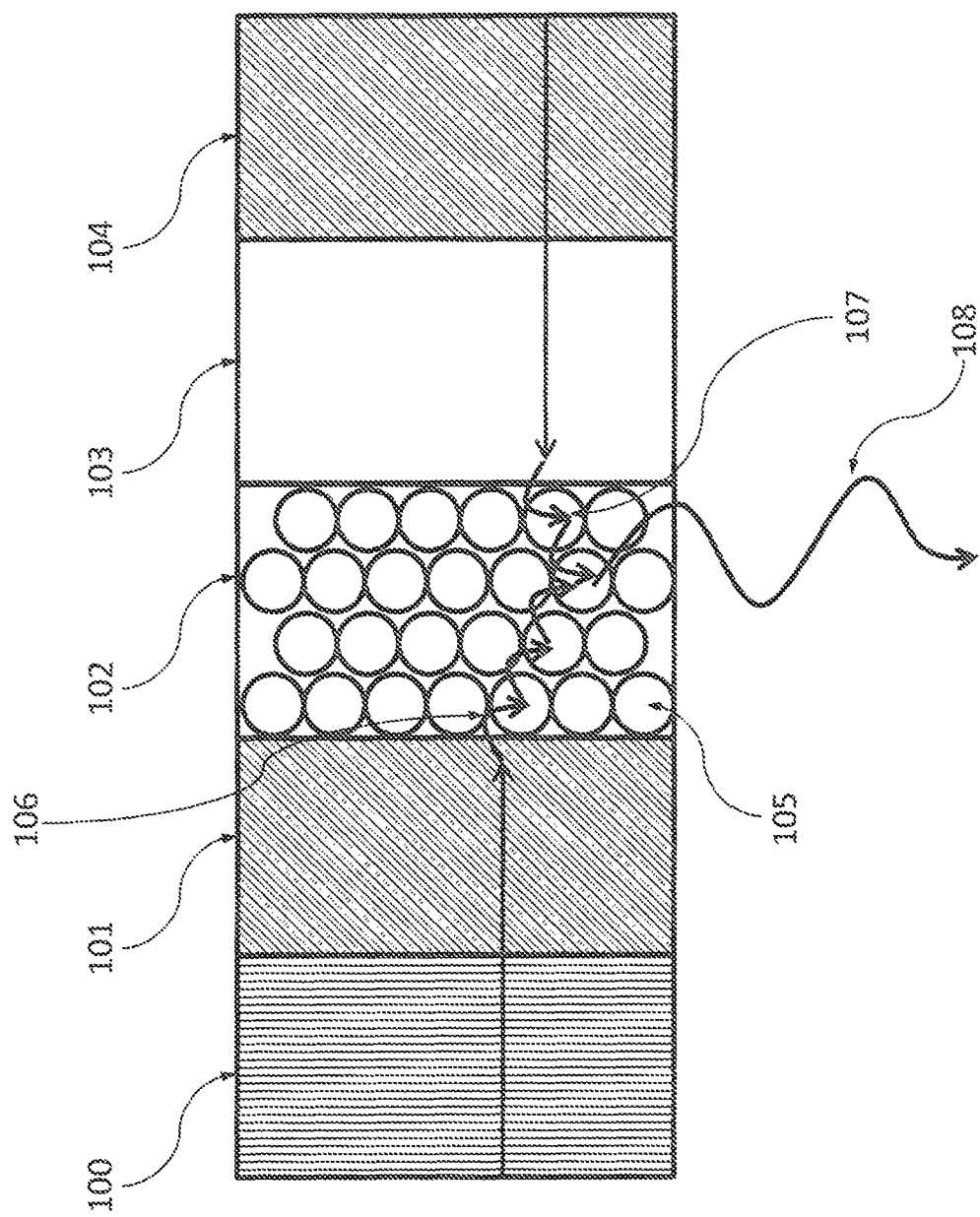
FIG. 1 is a drawing depicting an exemplary representation of a light-emitting device.

Embodiments of the present invention will now be described with reference to the drawings, wherein like reference numerals are used to refer to like elements throughout. It will be understood that the figures are not necessarily to scale.

A quantum dot light-emitting device (QD LED) that includes enhancements of the present invention overall may be structured comparably as a typical light-emitting device. Referring back to FIG. 1, therefore, a light-emitting device includes an anode 104 and cathode 100, and a light-emitting or emissive layer 102 containing a material that emits light 108. Within the light-emitting layer 102, light is produced upon electron and hole recombination to generate the light 108. The light-emitting emissive layer 102 includes quantum dots (QDs) 107. At least one hole transport layer 103 is located between the anode 104 and the emissive layer 102, which provides transport of holes from the anode and injection of holes into the emissive layer. Similarly, at least one electron transport layer 101 is located between the cathode 100 and emissive layer 102, which provides transport of electrons from the cathode and injection of electrons into the emissive layer.

In such structure, the layer (or layers) 101 between the cathode 100 and emissive layer 102 is termed the electron transport layer (ETL), and the layer (or layers) 103 between the anode 104 and the emissive layer 102 is termed the hole transport layer (HTL). The ETL and HTL are collectively referred to more generally as charge transport layers (CTL). The purpose of these CTLs is to provide an ohmic contact to the respective electrode (anode or cathode), and to provide energetic alignment for injecting carriers (electrons or holes) into the emissive layer. The electrons and holes recombine within the emissive layer 102 to generate the light 108.

In embodiments of the present invention, an improved quantum dot (QD) configuration enhances luminescence quantum efficiency, by optimizing a balance between the rate of recombination versus charge carrier mobility, and especially hole mobility. To increase the limiting carrier mobility in a QD emissive layer, the QDs in the emissive layer include at least a portion of QDs with a Quasi-Type II band structure configuration. As referenced above, in a Quasi-Type II band structure configuration, one type of charge carrier is confined to the QD core while the other type of charge carrier is not confined to the core or shell of the QD. In a preferred embodiment, the non-confined charge carriers are the holes, insofar as hole mobility tends to be most limiting to luminescence quantum efficiency due to the substantially larger mass of the holes relative to the electrons. The emissive layer may include a mixture or matrix of Quasi-Type II QDs and Type I QDs in combination.

Figure 2:
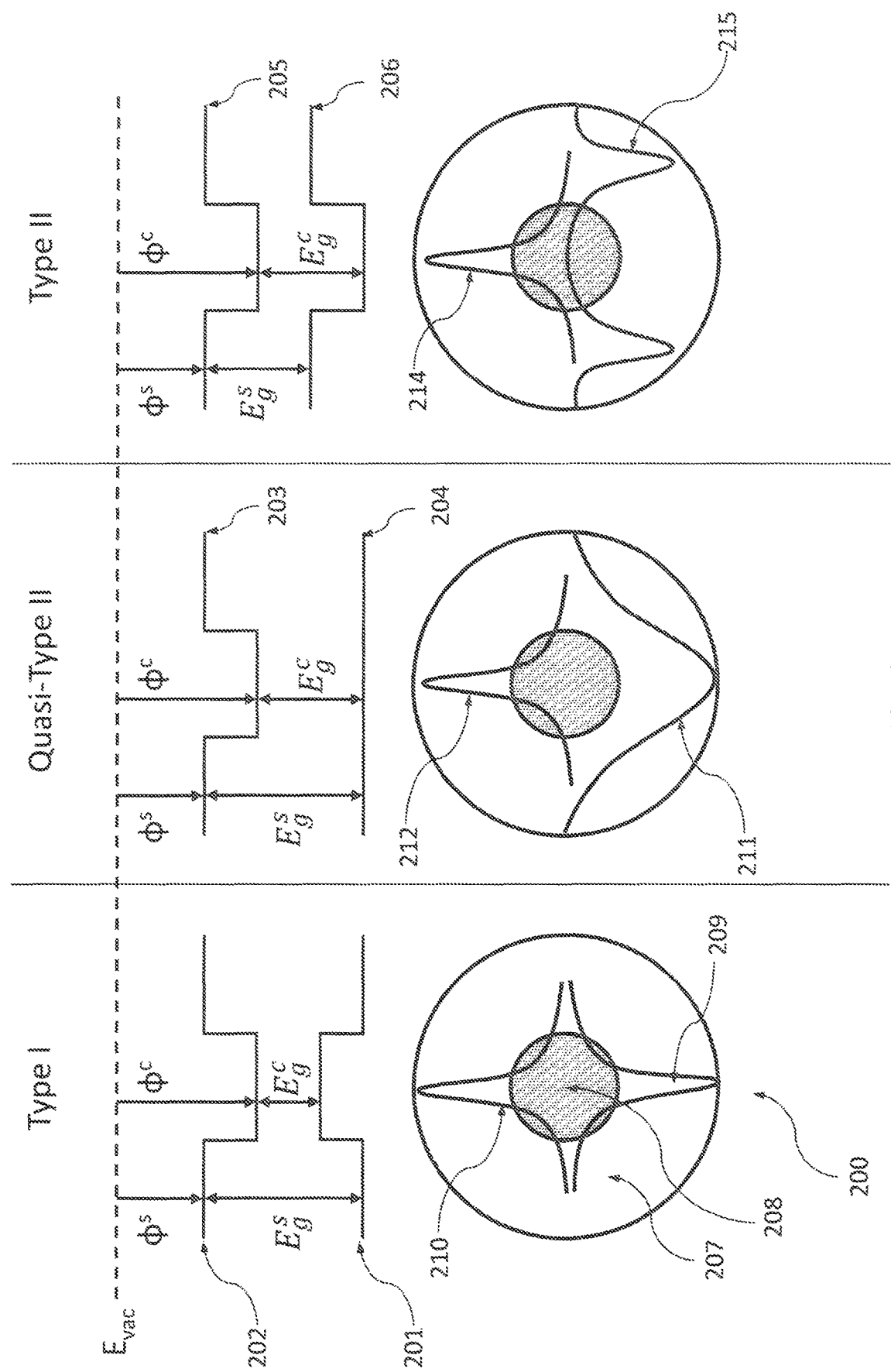
FIG. 2 is a drawing depicting and comparing the different types of QD structures.

FIG. 2 is a drawing depicting and comparing the different types of QD structures as relating to charge carrier confinement. Charge carrier confinement occurs because of a discontinuity in the potential of the valence or conduction band, with the charge carrier remaining in the lowest potential region and being excluded from the region with a higher potential energy. The three possible confinement types for a core/shell QD are illustrated in FIG. 2. As denoted in FIG. 2, $E_{vac}$ refers to the base line energy of free space. $\varphi$ denotes the potential barrier that acts as a barrier to charge carrier hopping for the movement of the charge carrier through the emissive layer, and $E_g$ denotes the band gap energy. The superscripts "s" and "c" denote the given parameter being associated with either the core or shell of a core/shell type quantum dot.

In these figures, a QD 200 includes a shell 207 that surrounds a core 208, and radiative recombination occurs by recombination of electrons and holes within the core 208. The left portion of FIG. 2 illustrates a Type I QD configuration. In a Type I QD configuration, both electron and hole are confined to the core region 208 of the QD 200. The conduction band 202 of the electrons and the valence band 201 of the holes have a discontinuity between the core region 208 and shell region 207, and the region of lowest potential energy is the core region. This results in the electron wavefunction 210 and the hole wavefunction 209 being confined to the core region 208, as illustrated using the representative wavefunctions 209 and 210 in the left portion of FIG. 2. As referenced above, in a Type I configuration there is a substantial overlap of the wavefunctions within the QD core 208, which results in a high rate of radiative recombination. Accordingly, as referenced above conventional teaching is that the use of only Type I QD structures in the emissive layer maximizes luminescence quantum efficiency.

The right portion of FIG. 2 illustrates a Type II QD configuration. In a Type II QD configuration, electrons and holes are confined to different regions of the QD structure, such as for example the electrons being confined to the core region 208 and the holes being confined to the shell region 207 (which is depicted in the right portion of FIG. 2), or conversely the electrons being confined to the shell region and the holes being confined to the core region. In a Type II configuration, the conduction band 205 of the electron and the valence band 206 of the hole have a discontinuity between the core region and shell region, and the region of lowest potential energy is in different regions for the electron and hole. In the confinement example shown in the right portion of FIG. 2, this results in the electron wavefunction 214 and hole wavefunction 215 being confined to the core and shell respectively. The Type II configuration, therefore, has minimal overlap of the wavefunctions within the QD core, and thus recombination of electrons and holes essentially can occur only at the core/shell boundary. A Type II configuration, therefore, has only a minimal recombination rate, and thus generally is unsuitable for a QD emissive layer and is depicted here principally for illustrative purposes.

The center portion of FIG. 2 illustrates a Quasi-Type II QD configuration. As referenced above, in a Quasi-Type II QD configuration only one of the types of charge carriers is confined in the core region 208, while the other charge carrier type is not confined and may be distributed within both the core regions 208 and the shell regions 207 of the QDs. In other words, there is a band discontinuity between the core and shell of the QD in only one of the valence band or conduction band, and the other band is substantially continuous. As used herein, a band structure, i.e., the conduction or valence band, is considered substantially continuous or lacking a discontinuity when the band has a discontinuity that is 0.10 eV or less, and preferably 0.05 eV or less, between the core and shell regions. The confined charge carriers thus will have a band structure having a discontinuity greater than such threshold (i.e., preferably greater than 0.05 eV or greater than 0.1 eV).

In a preferred embodiment, the charge carrier having the continuous band is the hole, i.e. the valence band is continuous, which is the configuration depicted in the center portion of FIG. 2. In the center portion of FIG. 2, the conduction band 203 of the electrons has a discontinuity between core and shell, resulting in a confined electron wave function 212 within the core region 208. In addition, the valence band 204 of the holes has substantially no discontinuity (i.e., 0.1 eV or less, or preferably 0.05 eV or less) and permits the hole wavefunction 211 to spread over the entire core/shell region. As a result, the overlap of the wavefunctions within the core for a Quasi-Type II configuration is less than the overlap in a Type I configuration, and thus the rate of recombination is lower for a Quasi-Type II configuration than for a Type I configuration. Conversely, the overlap of the wavefunctions with the core for a Quasi-Type II configuration is greater than the overlap in a Type II configuration, and thus the rate of recombination is greater for a Quasi-Type II configuration than for a Type II configuration.

Figure 3:
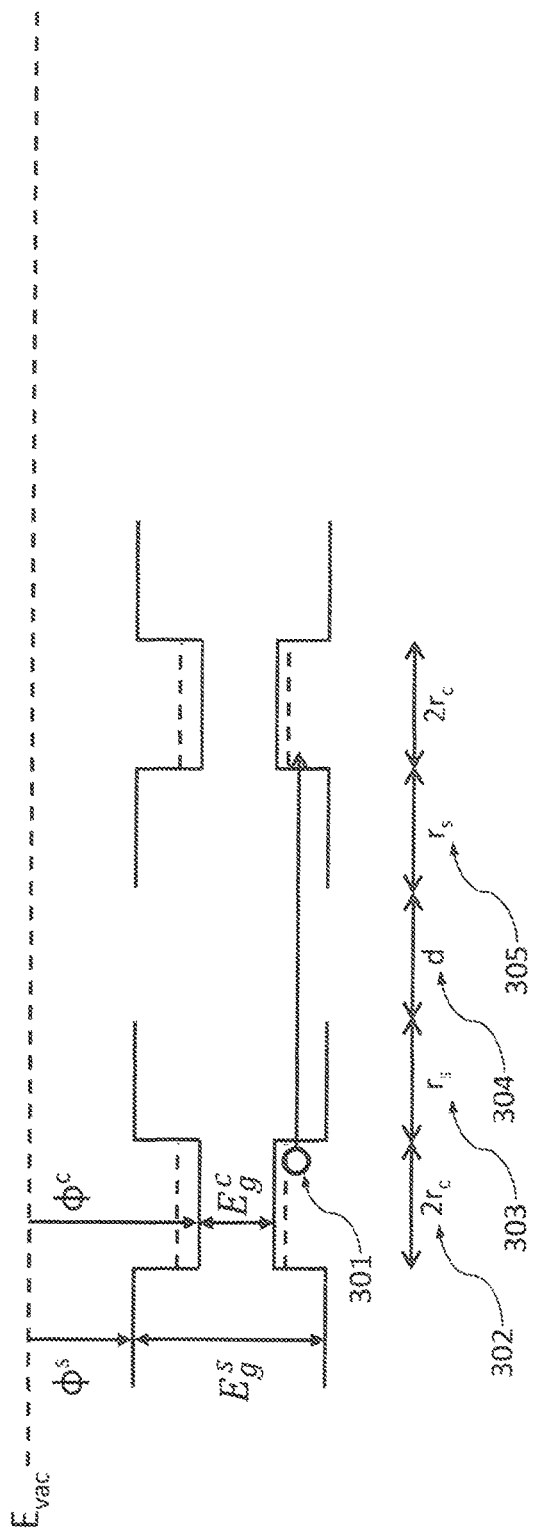
FIG. 3 is a drawing illustrating the difference between Type I QD carrier mobility versus Quasi-Type II QD carrier mobility.
Figure 3:
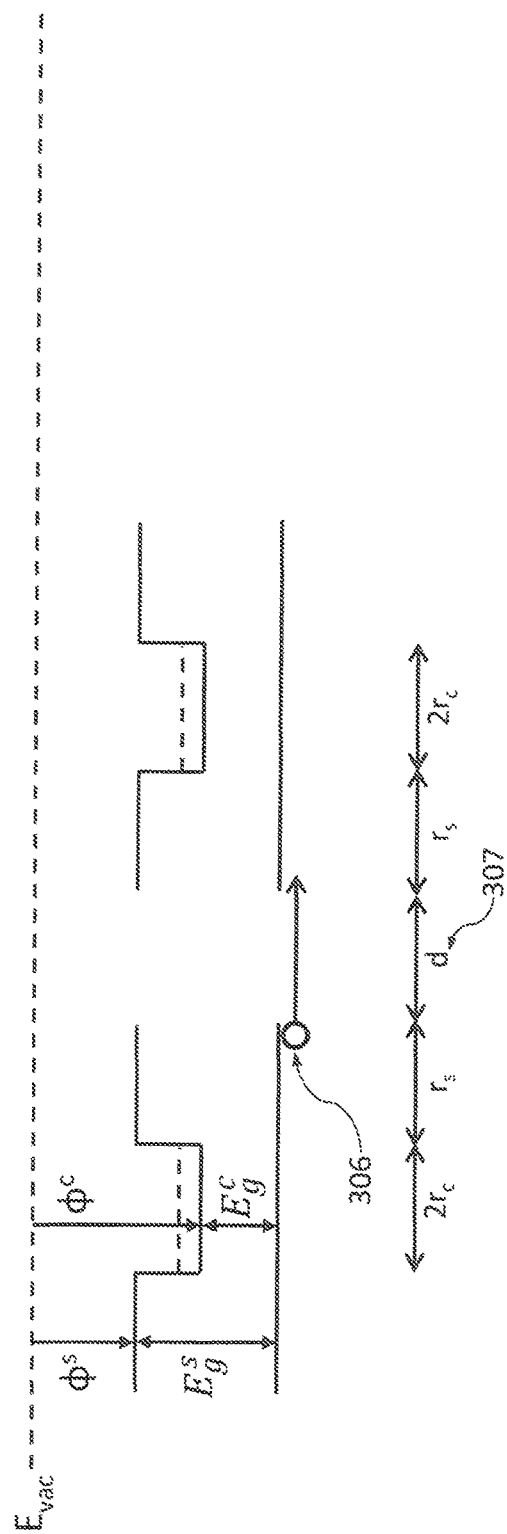

Despite the reduced recombination rate as compared to Type I QDs, Quasi-Type II QDs offset such difference with improved carrier mobility. FIG. 3 is a drawing illustrating the difference between Type I QD carrier mobility versus Quasi-Type II QD carrier mobility. In general, using a matrix of Quasi-Type II QDs reduces the barrier to carrier hopping between adjacent QDs, as compared with using Type I QDs, by reducing the distance required for non-confined charge carriers to hop from QD to QD. This reduced hopping distance exponentially increases the effective carrier mobility through the emissive layer.

Referring to FIG. 3, the top portion illustrates the hole transfer between QDs when the emissive layer is formed using Type I QDs. With such configuration, a hole 301 is confined to the core region of one QD, and the diameter 302 of the QD is twice the radius, or denoted in FIG. 3 as 2re. To transfer to an adjacent QD, the hole must tunnel through the shell of this QD (reference numeral 303 denoted thickness $r_s$), the distance between the two QDs (reference numeral 304 denoted distance d), and then tunnel through the shell of the adjacent QD (reference numeral 305 also denoted thickness $r_s$). The total distance of travel between the two QDs is therefore $2r_s+d$. The bottom portion of FIG. 3 illustrates the hole transfer between QDs when the emissive layer is formed using Quasi-Type II QDs. With such configuration in which the holes are not confined to the core region or shell region, a hole 306 freely can extend into the shell region of the QD, so the hole no longer needs to tunnel through the two shell regions of the adjacent QDs. As a result, the tunnelling distance is reduced to simply the distance d (reference numeral 307) between the two QDs. Similar principles apply to hopping distances when the confined charge carriers are the holes and the non-confined charge carriers are the electrons.

The overall mobility of the charge carriers through the QD emissive layer is proportional to the hopping rate between two adjacent QDs. This hopping rate scales exponentially with the distance that separates the QDs and the mass of the hopping charge carrier (electron or hole). Accordingly, when a hole is required only to tunnel from shell to shell across the distance d between QDs in a Quasi-Type II QD matrix, rather than core-to-core as in a Type I QD matrix, the hopping rate (Γ) (and therefore the carrier mobility) will increase exponentially as:

$$\frac{\Gamma_{Quasi-Type\ II}}{\Gamma_{Type\ I}} \propto e^{\frac{(2r_s)\sqrt{2m\varphi}}{\hbar}} \quad 1$$

in which:
$r_s$=the width of the QD shell layer,
m=the mass of the hopping charge carrier (electron or hole),
φ=the height of the potential barrier provided by the shell, and
$\hbar$=the reduced Planck's constant.

By not having to hop through the extra distance provided by tunnelling through the shells of adjacent QDs, the increase in hole mobility for a Quasi-Type II configuration composed of a typical material system, e.g. using InP/ZnTe with a Quasi-Type II band structure as compared with InP/ZnS with a Type I band structure, is three to four orders of magnitude greater in mobility. Accordingly, with such substantially increased hole mobility, an effective luminescence quantum efficiency can be achieved using a Quasi-Type II configuration even considering the reduced recombination rate as compared to the Type I configuration.

A Quasi-Type II configuration is achieved based on an appropriate selection of a material combination for the core/shell QD structure in the emissive layer, which results in core confinement of one charge carrier with the other charge carrier not being confined to the core or shell. Examples of material combinations which form a Quasi-Type II band structure include, but are not limited to, the following core/shell QD structures:

CdSe/CdS: confined electrons and mobile holes;
PbSe/PbSe$_x$S$_{1-x}$ in which 0<x<1 confined holes and mobile electrons;
CuInS$_2$/CdS: large electron confinement (~0.95 eV) and a very small hole confinement (~0.05 eV) with a photoluminescence (PL) wavelength tuneable between 550-950 nm;
InP/ZnTe: large electron confinement (~1.25 eV) and a very small hole confinement (~0.05 eV) with a PL wavelength tuneable between 500-750 nm;
InP/ZnS$_x$Se$_y$Te$_{(1-x-y)}$, in which 0<x<1, 0<y<1, and the precise values are chosen to minimize the hole confinement in the valence band; and
Various ternary and quaternary structures in the group consisting of Cd$_x$Zn$_{(1-x)}$Se$_y$S$_{(1-y)}$/ZnTe$_z$Se$_{(1-z)}$, in which 0<x<1, 0<y<1, 0<z<1, and the precise values are chosen to minimize the hole confinement in the valence band.

To determine the carrier confinement potential present in a QD, one can examine the integrated photoluminescence intensity as a function of QD layer temperature. The photoluminescence intensity decreases once the carriers are not substantially confined, which happens once sufficient thermal energy is present such that the carriers can overcome the potential barrier present in the conduction or valence band. This gives the characteristic dependence of photoluminescence on temperature, as illustrated for example in FIG. 4.

Figure 4:
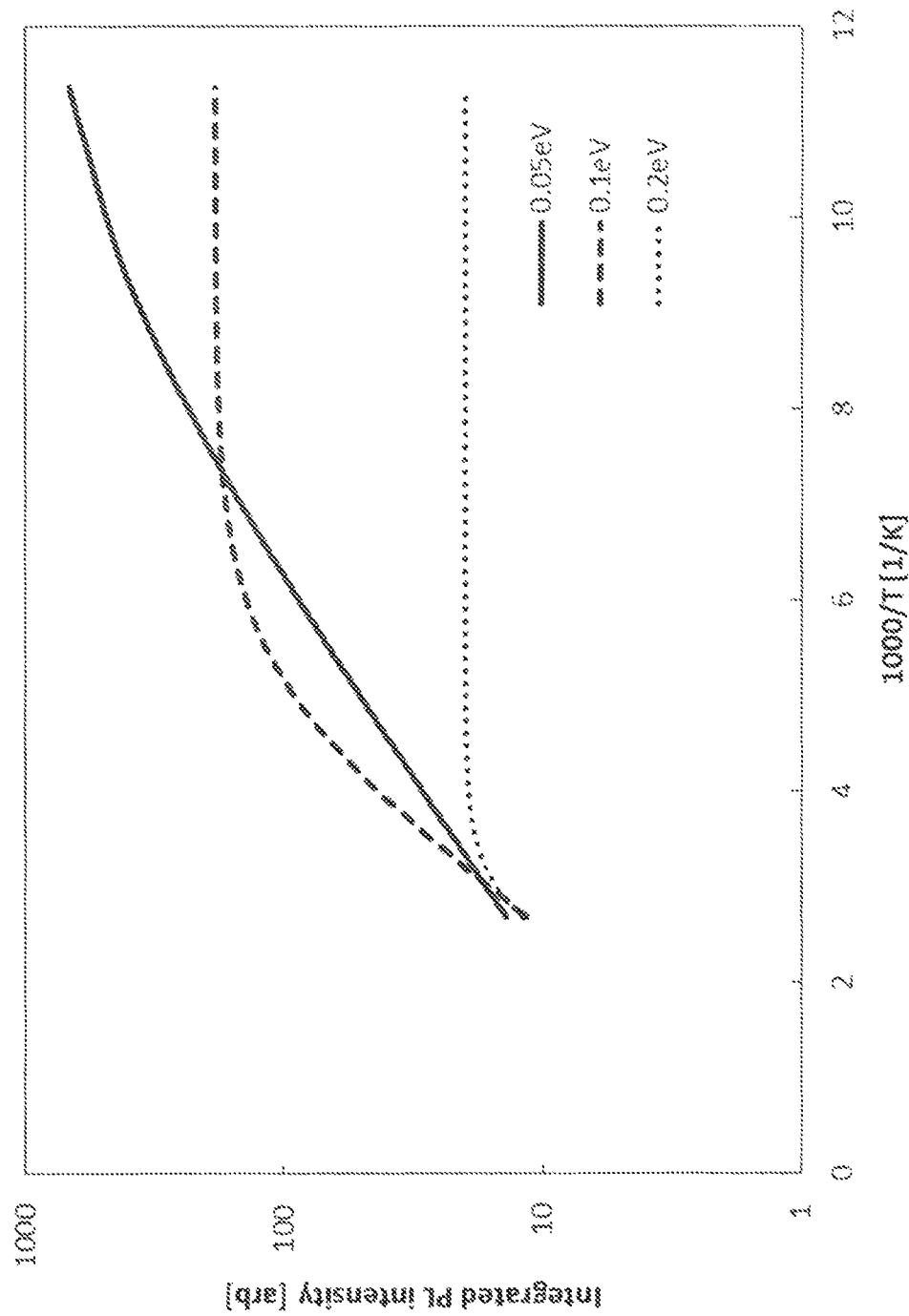
FIG. 4 is a graph depicting characteristic dependence of photoluminescence on temperature for QD structures, by which Type I versus Quasi-Type II QD structures may be defined.

FIG. 4 depicts the integrated photoluminescence (PL) intensity as a function of inverse temperature. As illustrated in FIG. 4, the photoluminescence increases as temperature decreases since the charge carrier becomes more confined, and thus recombination rather than carrier transfer is favored. Once a certain temperature is reached, no further confinement increase occurs, i.e. the carrier cannot be thermally excited out of the potential, and so the photoluminescence plateaus. FIG. 4 presents the photoluminescence as a function of inverse temperature for three different confinement levels, 0.05 eV, 0.1 eV and 0.2 eV. For a confinement potential of 0.05 eV or less, a very low temperature (e.g., less than 80° K) is required before full confinement of carriers occurs, since the photoluminescence is still increasing as temperature is reduced. This effect is somewhat less for a confinement potential of 0.1 eV, and essentially not observed for a confinement potential of 0.2 eV. For this reason, a conduction or valence band is considered substantially continuous or lacking a discontinuity, and thus is considered a Quasi-Type II QD rather than a Type I QD, when the band has a discontinuity that is 0.10 eV or less, and preferably 0.05 eV or less, between the core and shell regions.

A QD LED with an emissive layer containing such Quasi-Type II QDs provides at least the following significant advantages over conventional configurations that include only Type I QDs:

1. There is an increase in the hopping mobility through a matrix of QDs while maintaining the simple solution-based fabrication processes of combinations of typical materials.
2. There is maintained enhanced radiative recombination provided by colloidal QDs in comparison to bulk semiconductor material, because quantum confinement is still present in either the valence or conduction band.
3. Using Quasi-Type II QDs beneficially allows a thicker emissive layer, since carrier transport generally restricts the total thickness of the emissive layer, so by increasing the carrier mobility the emissive layer can be thicker.
4. A more uniform recombination profile is achieved, because carriers can move through the entire emissive layer before recombining, rather than being stuck at a QD interface.
5. Higher luminescence quantum efficiency is achieved as compared to conventional configurations as a result of a better balance between electron and hole mobility, yielding lower non-radiative auger recombination.
6. Using Quasi-Type II QDs advantageously permits lower voltage operation of the light-emitting devices, because higher carrier mobility makes the QD emissive layer less resistive, so the devices can operate at lower voltage for a given current.

These advantages mitigate the principal disadvantage of Quasi-Type II QDs, that the radiative recombination rate is lower that for Type I QDs, due to lower confinement of one charge carrier. This reduced radiative recombination rate in a single QD is why the use of Quasi-Type II QDs conventionally is taught against in light emission applications. The inventors have found, however, that with the improved carrier mobility, the emissive layer thickness can be increased so as to optimize overall radiative recombination, especially when charge carrier injection is taken into account. Accordingly, the overall luminescence quantum efficiency is increased as compared to conventional configurations as specifically taught in the art, and thus the use of Quasi-Type II QDs yields unexpected and enhanced results insofar as the conventional teaching is to preclude the use of Quasi-Type II QDs for light-emitting devices.

An aspect of the invention, therefore, is a light-emitting device by which luminescence quantum efficiency is enhanced by configuring the emissive layer to include quantum dots a portion of which have a Quasi-Type II configuration. In exemplary embodiments, a light-emitting device includes an emissive layer in which first and second charge carriers recombine to emit light; a first electrode from which the first charge carriers are generated and a second electrode from which the second charge carriers are generated; a first charge transport layer that injects the first charge carriers from the first electrode into the emissive layer; and a second charge transport layer that injects the second charge carriers from the second electrode into the emissive layer. The emissive layer includes quantum dots having a core in which the first and second charge carriers recombine and a shell, and at least a portion of the quantum dots have a Quasi-Type II configuration in which the first charge carriers are confined to the core and the second charge carriers are non-confined charge carriers that are not confined to the core or the shell. The first (confined) charge carriers may be the electrons and the second (non-confined) charge carriers may be the holes, or vice versa. The non-confined charge carriers have a discontinuity in the corresponding band structure (valence band for non-confined holes; conduction band for non-confined electrons) that is 0.1 eV or less, and preferably 0.05 eV or less. The confined charge carriers thus will have a band structure having a discontinuity greater than such threshold (i.e., preferably greater than 0.05 eV or greater than 0.1 eV). In a preferred embodiment, the non-confined charge carriers are the holes Several embodiments of an emissive layer and a related light-emitting device that employs QDs with a Quasi-Type II structure can yield the advantages detailed above. As described above, such a light-emitting device generally may have the overall structure depicted in FIG. 1. The emissive layer 102 includes core/shell quantum dots (QDs), and at least a portion of the QDs has a Quasi-Type II structure. In one exemplary embodiment, the emissive layer includes only quantum dots with a Quasi-Type II band structure. The non-confined charge carriers may be either the electrons or the holes, but in a preferred embodiment the non-confined charge carriers are the holes because of their substantially greater mass that is a barrier to carrier mobility.

Figure 5:
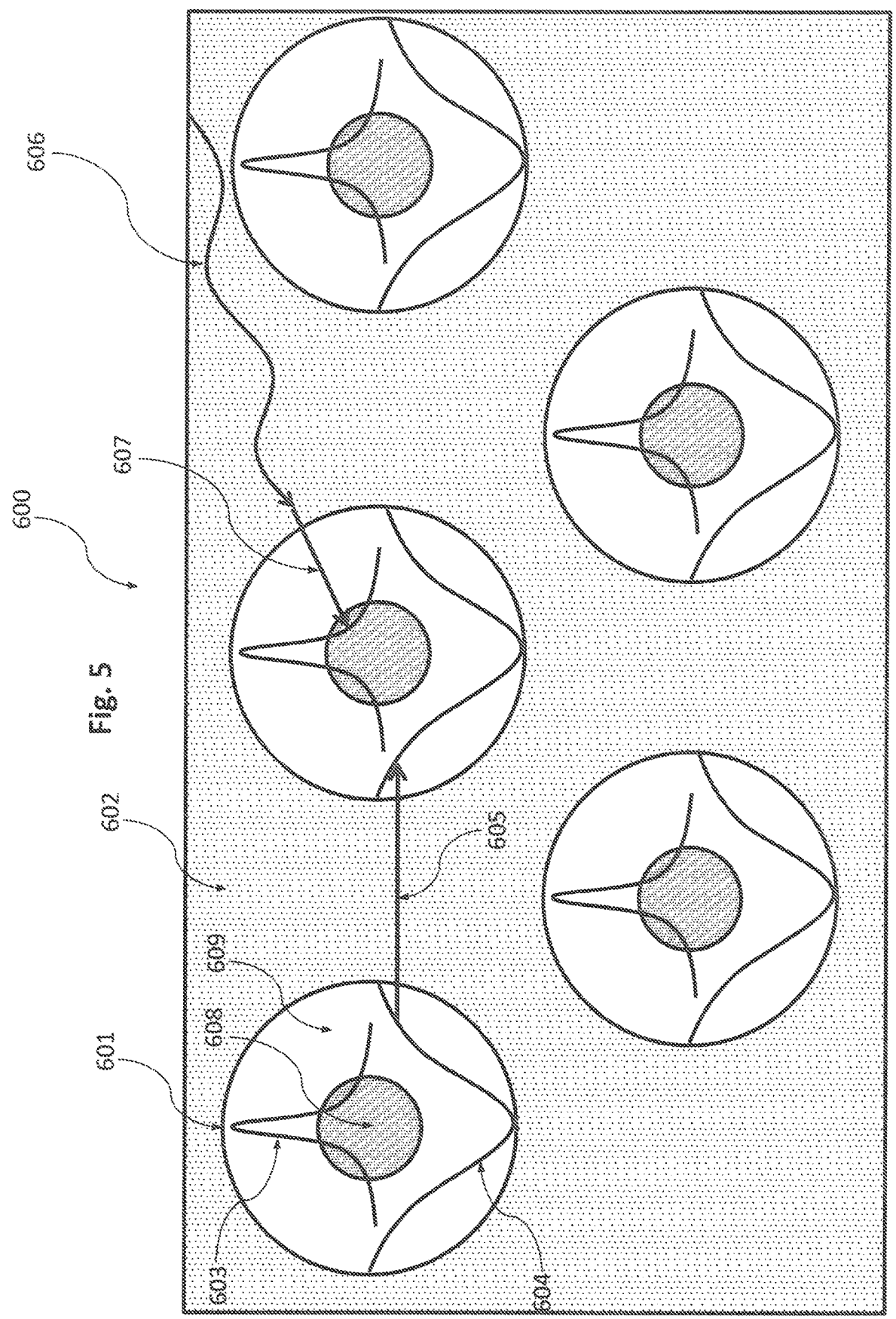
FIG. 5 is a drawing depicting an exemplary emissive layer for use in a light-emitting device in accordance with embodiments of the present invention.

In accordance with such features, FIG. 5 is a drawing depicting an exemplary emissive layer 600 for use in a light-emitting device in accordance with embodiments of the present invention. In this example, the emissive layer 600 includes a matrix of core/shell QDs in which all of the QDs have a Quasi-Type II structure. Referring to the figure, the emissive layer 600 includes a matrix of core/shell QDs 601 that each has a Quasi-Type II band structure, and the QDs 601 are embedded in a transport material 602. The QDs 601 each exhibits a first carrier wavefunction 603 for a first charge carrier confined to the core 608, and a second carrier wavefunction 604 for a second charge carrier that is non-confined whereby the second charge carrier is able to exist in both the core 608 and shell 609. In an exemplary embodiment, the first and confined charge carriers are the electrons, and the second and non-confined charge carriers are the holes.

In exemplary embodiments, the QDs are embedded in a complementary transport material 602 that facilitates the mobility of the first (confined) charge carriers through the emissive layer. For example, when the confined charge carriers are the electrons and the non-confined charge carriers are the holes, the emissive layer is comprised of such QDs 601 embedded in a transport material 602 with good electron transfer properties, also referred to as an electron transport material. The electron transport material 602 should have high electron mobility and a lowest unoccupied molecular orbital (LUMO, or conduction band minimum) level substantially matched to the conduction band level in the core of the QD. In such an emissive layer, hole transport progresses by direct tunnelling 605 between the QDs, whereas electron transport occurs through drift or diffusive transport 606 through the electron transport material 602, followed by tunnelling 607 of electrons into the QD. An example of this type of emissive layer comprises InP/ZnTe Quasi-Type II QDs embedded in an electron transport material matrix of TPBi (2,2',2''-(1,3,5-Benzinetriyl)-tris(1-phenyl-1-H-benzimidazole).

A comparable configuration can be employed in which the confined charge carriers are the holes, whereby the hole wavefunction of the Quasi Type-II QD is confined. The electrons thus are the non-confined charge carriers whereby the electron wavefunction exists in both the core and shell. With such configuration, the transport material 602 may be a hole transport material, and the QDs are embedded in a hole transport material. In such embodiment, the hole transport material has a high hole mobility and the highest occupied molecular orbital (HOMO, also referred to as a valence band maximum) of the hole transport material is substantially aligned with the valence band of the QDs. In such an emissive layer, electron transport progresses by direct tunnelling 605 between the QDs, whereas hole transport occurs through drift or diffusive transport 606 through the hole transport material 602, followed by tunnelling 607 of holes into the QD. Example materials include but are not limited to derivatives of TPD (N,N'-Bis(3-methylphenyl)-N, N'-diphenylbenzidine), TFB (Poly(9,9-dioctylfluorene-alt-N-(4-sec-butylphenyl)-diphenylamine)) or PVK (Poly(9-vinylcarbazole))]

Figure 6:
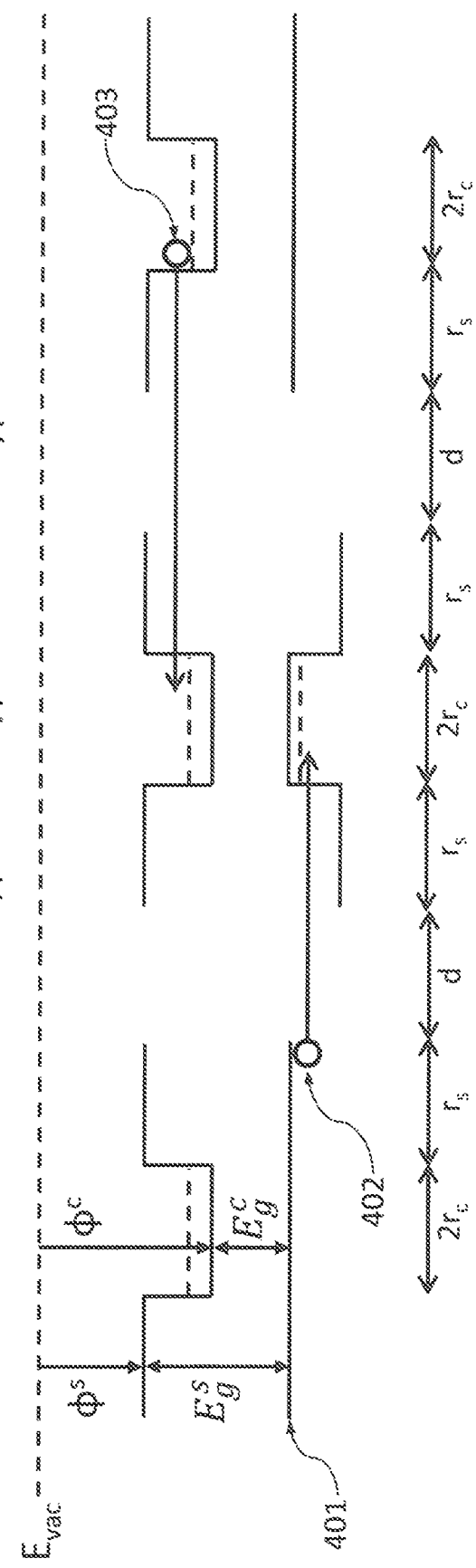
FIG. 6 is a drawing illustrating carrier mobility for a matrix including both Type I QDs and Quasi-Type II QDs.

In other exemplary embodiments, the emissive layer includes a mixture of Quasi-Type II QDs and Type I QDs to obtain in part the benefits of increased charge mobility from the Quasi-Type II QDs, while still maintaining in part the higher radiative recombination rate of Type I QDs. In accordance with such configuration, FIG. 6 is a drawing illustrating carrier mobility for a matrix including both Type I QDs and Quasi-Type II QDs, using notation comparable to that of FIG. 3. As shown in FIG. 6, the Quasi-Type II QDs have no (e.g., <0.05 eV) discontinuity in the valence band 401, allowing for improved hopping of holes 402. Electron hopping 403 is generally faster due to their lower mass. Essentially, with a mixture of Quasi-Type II QDs and Type I QDs, to hop between the two types of QDs, holes must hop the distance "d" between QDs of different types, and then must tunnel through the shell of the Type I QD a distance of $r_s$. (or first tunnel through a Type I QD shell and the hop the distance "d" to the adjacent Quasi-Type II QD). The total distance, therefore, is $d+r_s$.

In this example, therefore, the hopping distance is reduced relative to the distance when all QDs are Type I as shown in the top portion of FIG. 3 (d+2$r_s$), but greater than the distance when all QDS are Quasi-Type II as shown in the bottom portion of FIG. 3 (just d). Accordingly, adjustment to carrier mobility is balanced against the higher recombination rate that occurs by including some Type I QDs.

There is a combined benefit by partially enhancing both carrier mobility and recombination rate, relative to an emissive layer in which the QDs are of uniform type which experience one or the other of high recombination rate (all Type I) or high carrier mobility (all Quasi-Type II). One example of materials to realize this mixed structure would be a combination of InP/ZnTe Quasi-Type II QDs and InP/ZnS Type I QDs comprising the emissive layer. A similar configuration may be formed in which the Quasi-Type II QDs have a discontinuity in the valence band providing hole confinement, and no (<0.05 eV) discontinuity in the conduction band providing non-confined electrons. These Quasi-Type II QDs are then mixed with Type I QDs. Such emissive layers further may include a transport material (e.g., electron transport material or hole transport material) correspondingly selected to facilitate carrier transport of the confined charge carrier between QDs.

Figure 7:
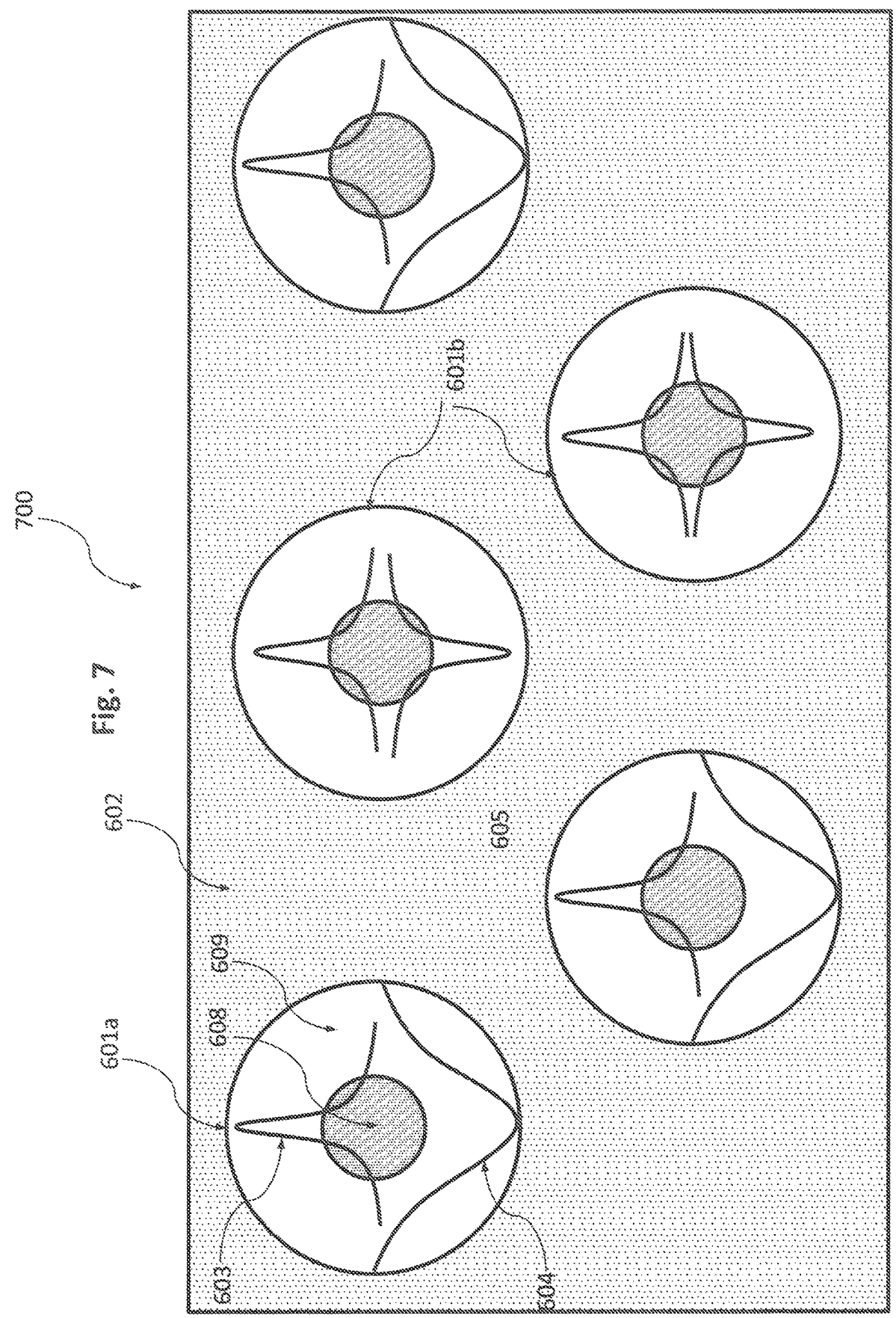
FIG. 7 is a drawing depicting another exemplary emissive layer for use in a light-emitting device in accordance with embodiments of the present invention.

In accordance with such features, FIG. 7 is a drawing depicting another exemplary emissive layer 700 for use in a light-emitting device in accordance with embodiments of the present invention. Like reference numerals are used to denote comparable elements as in FIG. 5. In this example, the emissive layer 700 includes a matrix of core/shell QDs in which QDs 601a having a Quasi-Type II structure are interspersed with QDs 601b having a Type I structure. As referenced above, for the Quasi-Type II QDs the non-confined charge carrier may be either electrons or holes, and preferably are holes due to their substantially greater mass. In addition, the transport material 602 may be correspondingly selected to facilitate carrier transport of the confined charge carrier between QDs.

An aspect of the invention, therefore, is a light-emitting device by which luminescence quantum efficiency is enhanced by configuring the emissive layer to include quantum dots a portion of which have a Quasi-Type II configuration. In exemplary embodiments, a light-emitting device includes an emissive layer in which first and second charge carriers recombine to emit light; a first electrode from which the first charge carriers are generated and a second electrode from which the second charge carriers are generated; a first charge transport layer that injects the first charge carriers from the first electrode into the emissive layer; and a second charge transport layer that injects the second charge carriers from the second electrode into the emissive layer. The emissive layer includes quantum dots having a core in which the first and second charge carriers recombine and a shell, and at least a portion of the quantum dots have a Quasi-Type II configuration in which the first charge carriers are confined to the core and the second charge carriers are non-confined charge carriers that are not confined to the core or the shell. The light-emitting device may include one or more of the following features, either individually or in combination.

In an exemplary embodiment of the light-emitting device, the non-confined charge carriers have a discontinuity in band structure that is 0.1 eV or less, and the confined charge carriers have a discontinuity in band structure that is greater than 0.1 eV.

In an exemplary embodiment of the light-emitting device, the non-confined charge carriers have a discontinuity in band structure that is 0.05 eV or less, and the confined charge carriers have a discontinuity in band structure that is greater than 0.05 eV.

In an exemplary embodiment of the light-emitting device, the first charge transport layer is an electron transport layer and the first charge carriers are electrons, whereby the confined charge carriers are the electrons and the electrons have a discontinuity in the conduction band; and the second charge transport layer is a hole transport layer and the second charge carriers are holes, whereby the non-confined charge carriers are the holes and the holes are substantially continuous in the valence band.

In an exemplary embodiment of the light-emitting device, the non-confined holes have a discontinuity in the valence band that is 0.1 eV or less, and the confined electrons have a discontinuity in the conduction band that is greater than 0.1 eV.

In an exemplary embodiment of the light-emitting device, the non-confined holes have a discontinuity in the valence band that is 0.05 eV or less, and the confined electrons have a discontinuity in the conduction band that is greater than 0.05 eV.

In an exemplary embodiment of the light-emitting device, the quantum dots having the Quasi-Type II configuration include one the following core/shell material compositions:
CdSe/CdS;
$CuInS_2$/CdS;
InP/ZnTe;
InP/$ZnS_xSe_yTe_{(1-x-y)}$, in which 0<x<1, 0<y<1; or
a ternary or quaternary structure in the group consisting of $Cd_xZn_{(1-x)}Se_yS_{(1-y)}$/$ZnTe_zSe_{(1-z)}$, in which 0<x<1, 0<y<1, 0<z<1.

In an exemplary embodiment of the light-emitting device, the first charge transport layer is a hole transport layer and the first charge carriers are holes, whereby the confined charge carriers are the holes and the holes have a discontinuity in the valence band; and the second charge transport layer is an electron transport layer and the second charge carriers are electrons, whereby the non-confined charge carriers are the electrons and the electrons are substantially continuous in the conduction band.

In an exemplary embodiment of the light-emitting device, the non-confined electrons have a discontinuity in the conduction band that is 0.1 eV or less, and the confined holes have a discontinuity in the valence band that is greater than 0.1 eV.

In an exemplary embodiment of the light-emitting device, the non-confined electrons have a discontinuity in the conduction band that is 0.05 eV or less, and the confined holes have a discontinuity in the valence band that is greater than 0.05 eV.

In an exemplary embodiment of the light-emitting device, the quantum dots having the Quasi-Type II configuration include a core/shell material composition including PbSe/$PbSe_xS_{1-x}$, in which 0<x<1.

In an exemplary embodiment of the light-emitting device, all the quantum dots in the emissive layer have the Quasi-Type II configuration.

In an exemplary embodiment of the light-emitting device, the emissive layer includes a matrix of quantum dots including quantum dots having the Quasi-Type II configuration interspersed with quantum dots having a Type I configuration in which both the first charge carriers and the second charge carriers are confined to the core of the quantum dot.

In an exemplary embodiment of the light-emitting device, the emissive layer includes a mixture of quantum dots having material compositions of InP/ZnTe Quasi-Type II QDs and InP/ZnS Type I QDs.

In an exemplary embodiment of the light-emitting device, the emissive layer includes a transport material in which the quantum dots are embedded, wherein the transport material is selected to facilitate transport of the confined charge carriers between quantum dots.

In an exemplary embodiment of the light-emitting device, the quantum dots have confinement of the electrons and the quantum dots are embedded in an electron transport material that is selected to facilitate transport of electrons.

In an exemplary embodiment of the light-emitting device, the emissive layer comprises InP/ZnTe Quasi-Type II quantum dots in which electrons are confined charge carriers, and the quantum dots are embedded in an electron transport material matrix of TPBi (2,2',2"-(1,3,5-Benzinetriyl)-tris(1-phenyl-1-H-benzimidazole).

In an exemplary embodiment of the light-emitting device, the quantum dots have confinement of the holes and the quantum dots are embedded in a hole transport material that is selected to facilitate transport of holes.

In an exemplary embodiment of the light-emitting device, the emissive layer comprises $PbSe/PbSe_xS_{1-x}$ Quasi-Type II quantum dots, in which $0<x<1$, in which holes are confined charge carriers, and the quantum dots are embedded in a hole transport material matrix of one of or a derivative of TPD (N,N'-Bis(3-methylphenyl)-N, N'-diphenylbenzidine), TFB (Poly(9,9-dioctylfluorene-alt-N-(4-sec-butylphenyl)-diphenylamine)) or PVK (Poly(9-vinylcarbazole)).

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to light-emitting devices that, for example, may be used for light-emitting elements in a display device, and QLED type display technology in particular. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high resolution display is desirable.

REFERENCE SIGNS LIST

100—cathode
101—electron transport layer
102—emissive layer
103—hole transport layer
104—anode
107—quantum dots
108—emitted light
200—quantum dot
201—valence band
202—conduction band
203—conduction band
204—valence band
205—conduction band
206—valence band
207—quantum dot shell
208—quantum dot core
209—hole wavefunction
210—electron wavefunction
211—hole wavefunction
212—electron wavefunction
214—electron wavefunction
215—hole wavefunction
301—hole
302—quantum dot diameter
303—tunnelling thickness
304—distance between two quantum dots
305—tunnelling thickness
306—hole
307—hopping distance
401—valence band
402—holes
403—electron hopping
600—emissive layer
601—Quasi-Type II quantum dots
601a—Quasi-Type II quantum dots
601b—Type I quantum dots
602—transport material
603—first carrier wavefunction
604—second carrier wavefunction
605—direct tunnelling
606—diffusive transport
607—electron transport material
608—core
609—shell
700—emissive layer

What is claimed is:

1. A light-emitting device comprising:
an emissive layer in which first and second charge carriers recombine to emit light;
a first electrode from which the first charge carriers are generated and a second electrode from which the second charge carriers are generated;
a first charge transport layer that injects the first charge carriers from the first electrode into the emissive layer; and
a second charge transport layer that injects the second charge carriers from the second electrode into the emissive layer;
wherein:
the emissive layer includes quantum dots having a core in which the first and second charge carriers recombine and a shell, and at least a portion of the quantum dots have a Quasi-Type II configuration in which the first charge carriers are confined to the core and the second charge carriers are non-confined charge carriers that are not confined to the core or the shell;
the first charge transport layer is an electron transport layer and the first charge carriers are electrons, whereby the confined charge carriers are the electrons and the electrons have a discontinuity in the conduction band; and the second charge transport layer is a hole transport layer and the second charge carriers are holes, whereby the non-confined charge carriers are the holes and the holes are substantially continuous in the valence band.

2. The light-emitting device of claim 1, wherein the non-confined holes have a discontinuity in the valence band that is 0.1 eV or less, and the confined electrons have a discontinuity in the conduction band that is greater than 0.1 eV.

3. The light-emitting device of claim 1, wherein the non-confined holes have a discontinuity in the valence band that is 0.05 eV or less, and the confined electrons have a discontinuity in the conduction band that is greater than 0.05 eV.

4. The light-emitting device of claim 1, wherein the quantum dots having the Quasi-Type II configuration include one the following core/shell material compositions:
CdSe/CdS;
CuInS$_2$/CdS;
InP/ZnTe;
InP/ZnS$_x$Se$_y$Te$_{(1-x-y)}$, in which 0<x<1, 0<y<1; or
a ternary or quaternary structure in the group consisting of Cd$_x$Zn$_{(1-x)}$Se$_y$S$_{(1-y)}$/ZnTe$_z$Se$_{(1-z)}$ in which 0<x<1, 0<y<1, 0<z<1.

5. The light emitting device of claim 1, wherein all the quantum dots in the emissive layer have the Quasi-Type II configuration.

6. The light emitting device of claim 1, wherein the emissive layer includes a matrix of quantum dots including quantum dots having the Quasi-Type II configuration interspersed with quantum dots having a Type I configuration in which both the first charge carriers and the second charge carriers are confined to the core of the quantum dot.

7. The light-emitting device of claim 6, wherein the emissive layer includes a mixture of quantum dots having material compositions of InP/ZnTe Quasi-Type II QDs and InP/ZnS Type I QDs.

8. The light-emitting device of claim 1, wherein the emissive layer includes a transport material in which the quantum dots are embedded, wherein the transport material is selected to facilitate transport of the confined charge carriers between quantum dots.

9. The light-emitting device of claim 8, wherein the quantum dots have confinement of the electrons and the quantum dots are embedded in an electron transport material that is selected to facilitate transport of electrons.

10. The light-emitting device of claim 8, wherein the emissive layer comprises InP/ZnTe Quasi-Type II quantum dots in which electrons are confined charge carriers, and the quantum dots are embedded in an electron transport material matrix of TPBi (2,2',2''-(1,3,5-Benzinetriyl)-tris(1-phenyl-1-H-benzimidazole).

11. A light-emitting device comprising:
an emissive layer in which first and second charge carriers recombine to emit light;
a first electrode from which the first charge carriers are generated and a second electrode from which the second charge carriers are generated;
a first charge transport layer that injects the first charge carriers from the first electrode into the emissive layer; and a second charge transport layer that injects the second charge carriers from the second electrode into the emissive layer;
wherein:
the emissive layer includes quantum dots having a core in which the first and second charge carriers recombine and a shell, and at least a portion of the quantum dots have a Quasi-Type II configuration in which the first charge carriers are confined to the core and the second charge carriers are non-confined charge carriers that are not confined to the core or the shell;
the first charge transport layer is a hole transport layer and the first charge carriers are holes, whereby the confined charge carriers are the holes and the holes have a discontinuity in the valence band; and
the second charge transport layer is an electron transport layer and the second charge carriers are electrons, whereby the non-confined charge carriers are the electrons and the electrons are substantially continuous in the conduction band.

12. The light-emitting device of claim 11, wherein the non-confined electrons have a discontinuity in the conduction band that is 0.1 eV or less, and the confined holes have a discontinuity in the valence band that is greater than 0.1 eV.

13. The light-emitting device of claim 11, wherein the non-confined electrons have a discontinuity in the conduction band that is 0.05 eV or less, and the confined holes have a discontinuity in the valence band that is greater than 0.05 eV.

14. The light-emitting device of claim 11, wherein the quantum dots having the Quasi-Type II configuration include a core/shell material composition including PbSe/PbSe$_x$S$_{1-x}$, in which 0<x<1.

15. The light emitting device of claim 11, wherein all the quantum dots in the emissive layer have the Quasi-Type II configuration.

16. The light-emitting device of claim 11, wherein the emissive layer includes a mixture of quantum dots having material compositions of InP/ZnTe Quasi-Type II QDs and InP/ZnS Type I QDs.

17. The light-emitting device of claim 11, wherein the emissive layer includes a matrix of quantum dots including quantum dots having the Quasi-Type II configuration interspersed with quantum dots having a Type I configuration in which both the first charge carriers and the second charge carriers are confined to the core of the quantum dot.

18. The light-emitting device of claim 11, wherein the emissive layer includes a transport material in which the quantum dots are embedded, wherein the transport material is selected to facilitate transport of the confined charge carriers between quantum dots.

19. The light-emitting device of claim 18, wherein the quantum dots have confinement of the holes and the quantum dots are embedded in a hole transport material that is selected to facilitate transport of holes.

20. The light-emitting device of claim 18, wherein the emissive layer comprises PbSe/PbSe$_x$S$_{1-x}$ Quasi-Type II quantum dots, in which 0<x<1, in which holes are confined charge carriers, and the quantum dots are embedded in a hole transport material matrix of one of or a derivative of TPD (N,N'-Bis(3-methylphenyl)-N,N'-diphenylbenzidine), TFB (Poly(9,9-dioctylfluorene-alt-N-(4-sec-butylphenyl)-diphenylamine)) or PVK (Poly(9-vinylcarbazole)).

* * * * *